US 10,885,934 B2

(12) United States Patent
Degawa et al.

(10) Patent No.: US 10,885,934 B2
(45) Date of Patent: Jan. 5, 2021

(54) MAGNETORESISTANCE EFFECT DEVICE WITH SHAPED HIGH-FREQUENCY SIGNAL LINE OVERLAPPING MAGNETORESISTANCE EFFECT ELEMENT

(71) Applicant: TDK CORPORATION, Tokyo (JP)

(72) Inventors: Naomichi Degawa, Tokyo (JP); Tsuyoshi Suzuki, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 16/364,534

(22) Filed: Mar. 26, 2019

(65) Prior Publication Data
US 2019/0304491 A1 Oct. 3, 2019

(30) Foreign Application Priority Data
Mar. 30, 2018 (JP) .................. 2018-069964

(51) Int. Cl.
*G11B 5/39* (2006.01)
*G01R 33/09* (2006.01)
*H01L 43/08* (2006.01)
*H01L 43/10* (2006.01)
*H03H 9/22* (2006.01)
(Continued)

(52) U.S. Cl.
CPC ............ *G11B 5/398* (2013.01); *G01R 33/093* (2013.01); *G01R 33/098* (2013.01); *G11B 5/399* (2013.01); *H01F 10/329* (2013.01); *H01L 43/02* (2013.01); *H01L 43/08* (2013.01); *H01L 43/10* (2013.01); *H03H 9/22* (2013.01); *B82Y 25/00* (2013.01);
(Continued)

(58) Field of Classification Search
None
See application file for complete search history.

(56) References Cited

U.S. PATENT DOCUMENTS 6,466,419 B1 * 10/2002 Mao .................... G11B 5/3903
360/319
6,603,641 B1 8/2003 Sasaki
(Continued)

FOREIGN PATENT DOCUMENTS

| JP | 2017-063397 A | 3/2017 |
| JP | 2017-153066 A | 8/2017 |
| WO | 2007/032149 A1 | 3/2007 |

OTHER PUBLICATIONS

Tulapurkar, A. A. et al. "Spin-torque diode effect in magnetic tunnel junctions".Nature, vol. 438, No. 7066, pp. 339-342, 2005.
(Continued)

*Primary Examiner* — Craig A. Renner
(74) *Attorney, Agent, or Firm* — Oliff PLC

(57) ABSTRACT

Provided is a magnetoresistance effect device comprising a magnetoresistance effect element including a first ferromagnetic layer, a second ferromagnetic layer and a spacer layer, and a high-frequency signal line. The high-frequency signal line includes an overlapping part disposed at a position overlapping the magnetoresistance effect element and a non-overlapping part disposed at a position not overlapping the magnetoresistance effect element in a plan view from a stacking direction. At least a part of the non-overlapping part is disposed below the overlapping part in the stacking direction, assuming that the overlapping part is above the magnetoresistance effect element in the stacking direction.

3 Claims, 4 Drawing Sheets

(51) Int. Cl.
  *H01F 10/32*  (2006.01)
  *H01L 43/02*  (2006.01)
  *G11B 5/31*  (2006.01)
  *B82Y 25/00*  (2011.01)
(52) U.S. Cl.
  CPC .............. *G11B 5/31* (2013.01); *G11B 5/3909* (2013.01); *G11B 2005/3996* (2013.01)

(56) References Cited

U.S. PATENT DOCUMENTS

| | | | | |
|---|---|---|---|---|
| 6,700,760 | B1 * | 3/2004 | Mao | G11B 5/3909 360/324.2 |
| 7,280,325 | B1 * | 10/2007 | Pan | G11B 5/3932 360/319 |
| 2009/0185315 | A1 * | 7/2009 | Xue et al. | G11B 5/3909 360/314 |
| 2010/0232072 | A1 * | 9/2010 | Dimitrov et al. | G11B 5/3912 360/319 |
| 2010/0276791 | A1 | 11/2010 | Kaneko et al. | |
| 2016/0277000 | A1 | 9/2016 | Shibata et al. | |
| 2017/0244377 | A1 | 8/2017 | Yamane et al. | |
| 2018/0316077 | A1 * | 11/2018 | Yamane et al. | H01P 1/218 |
| 2019/0044500 | A1 | 2/2019 | Degawa et al. | |
| 2019/0180901 | A1 | 6/2019 | Kaizu et al. | |
| 2019/0304491 | A1 | 10/2019 | Degawa et al. | |
| 2019/0305215 | A1 | 10/2019 | Degawa | |

OTHER PUBLICATIONS

Nov. 6, 2019 Office Action Issued in U.S. Appl. No. 16/208,191.

K. Konishi, et al., "Radio-frequency amplification property of the MgO-based magnetic tunnel junction using field-induced ferromagnetic resonance", Appl. Phys. Lett 102, 162409 (Apr. 25, 2013).

* cited by examiner

MAGNETORESISTANCE EFFECT DEVICE WITH SHAPED HIGH-FREQUENCY SIGNAL LINE OVERLAPPING MAGNETORESISTANCE EFFECT ELEMENT

CROSS-REFERENCE TO RELATED APPLICATION

Priority is claimed on Japanese Patent Application No. 2018-069964, filed Mar. 30, 2018, the content of which is incorporated herein by reference.

BACKGROUND

The present disclosure relates to a magnetoresistance effect device using a magnetoresistance effect element.

In recent years, the speed of wireless communication has increased as mobile communication terminals such as cellular phones have become more sophisticated. Since the communication speed is proportional to the bandwidth of the frequency used, the frequency band required for communication has increased, and along with this, the number of high-frequency filters required for mobile communication terminals has also increased. Research on the field of spintronics, which is expected to be applied to new parts for use with high frequencies, has been actively conducted. One of the phenomena attracting attention regarding this is a spin torque resonance phenomenon of a magnetoresistance effect element (see e.g., Nature, Vol. 438, No. 7066, pp. 339-342, 17 Nov. 2005).

For example, by applying a static magnetic field to a magnetoresistance effect element using a magnetic field applying unit while causing an alternating current to flow through the magnetoresistance effect element, ferromagnetic resonance can be caused in the magnetization of a magnetization free layer included in the magnetoresistance effect element, and the resistance of the magnetoresistance effect element oscillates periodically at a frequency corresponding to the ferromagnetic resonance frequency. The resistance of the magnetoresistance effect element also oscillates likewise when applying a high-frequency magnetic field to the magnetization free layer of the magnetoresistance effect element. The ferromagnetic resonance frequency varies depending on the strength of the static magnetic field applied to the magnetoresistance effect element and is generally included in a high-frequency band of several to several tens of GHz.

A Patent Document discloses a technique of changing the ferromagnetic resonance frequency by changing the strength of a static magnetic field applied to a magnetoresistance effect element and suggests a device such as a high-frequency filter using this technique (see e.g., Japanese Unexamined Patent Application, First Publication No. 2017-153066).

The Patent Document discloses that a high-frequency current flows through a high-frequency signal line and a high-frequency magnetic field generated from the high-frequency signal line is applied to the magnetoresistance effect element. However, with a high-frequency signal line having the disclosed configuration, the strength of the high-frequency magnetic field applied to the magnetoresistance effect element is sometimes insufficient.

It is desirable to provide a magnetoresistance effect device including a high-frequency signal line capable of applying a high-frequency magnetic field having a great strength to a magnetoresistance effect element.

SUMMARY

The present disclosure provides the following aspects.

A magnetoresistance effect device according to an aspect of the present disclosure includes a magnetoresistance effect element including a first ferromagnetic layer, a second ferromagnetic layer and a spacer layer, and a high-frequency signal line, wherein in the magnetoresistance effect element, the first ferromagnetic layer, the second ferromagnetic layer, and the spacer layer are stacked such that the spacer layer is disposed between the first ferromagnetic layer and the second ferromagnetic layer, the high-frequency signal line includes an overlapping part disposed at a position overlapping the magnetoresistance effect element and a non-overlapping part disposed at a position not overlapping the magnetoresistance effect element in a plan view from a stacking direction, and at least a part of the non-overlapping part is disposed below the overlapping part in the stacking direction, assuming that the overlapping part is above the magnetoresistance effect element in the stacking direction.

DETAILED DESCRIPTION

Figure 1:
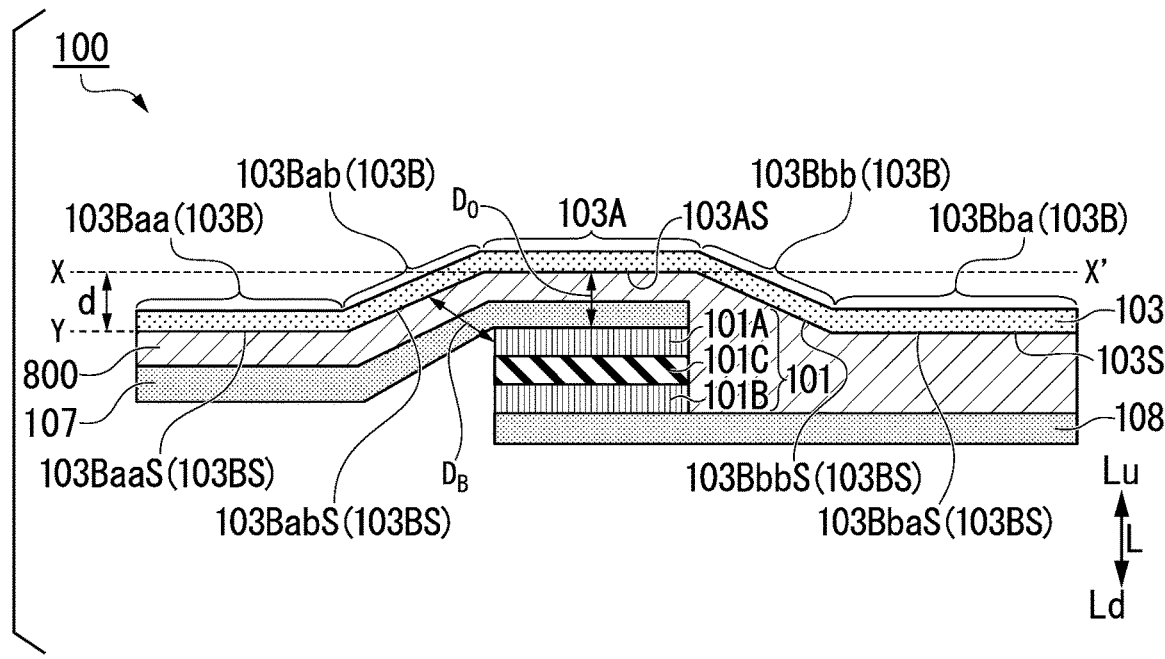
FIG. 1 is a cross-sectional view schematically showing an exemplary configuration of a magnetoresistance effect device 100 according to a first embodiment of the present disclosure.

The present disclosure will be appropriately described below in detail with reference to the drawings. In the drawings used in the following description, in order to facilitate understanding of features of the present disclosure, feature parts are enlarged for convenience of illustration in some cases, and dimensional proportions and the like of components may be different from those of actual components. Materials, sizes, and the like in the following description are exemplary examples, the present disclosure is not limited thereto, and they can be appropriately changed within a range in which effects of the present disclosure are obtained.

First Embodiment

FIG. 1 is a cross-sectional view schematically showing a configuration example of a magnetoresistance effect device 100 according to a first embodiment of the present disclosure.

The magnetoresistance effect device 100 includes at least a magnetoresistance effect element (MR element) 101 and a high-frequency signal line 103. In the magnetoresistance effect device 100, a magnetic field (a high-frequency magnetic field) generated from the high-frequency signal line 103 when a high-frequency current flows through the high-frequency signal line 103 and a magnetic field (a static magnetic field) generated from a magnetic field applying unit (not shown) (for example, a magnetic member) are applied to the magnetoresistance effect element 101.

In FIG. 1, a direction in which layers constituting a magnetoresistance effect element are stacked is defined as L, and in that direction, a direction toward the upper side in the drawing (a direction from a second ferromagnetic layer 101B toward a first ferromagnetic layer 101A) is defined as Lu, and a direction toward the lower side in the drawing (a direction from the first ferromagnetic layer 101A toward the second ferromagnetic layer 101B) is defined as Ld.

<Magnetoresistance Effect Element>

The magnetoresistance effect element 101 includes a first ferromagnetic layer 101A, a second ferromagnetic layer 101B and a spacer layer 101C (such as a nonmagnetic layer). The first ferromagnetic layer 101A, the second ferromagnetic layer 101B and the spacer layer 101C are stacked such that the spacer layer 101C is disposed between the first ferromagnetic layer 101A and the second ferromagnetic layer 101B. For example, the first ferromagnetic layer 101A functions as a magnetization free layer, and the second ferromagnetic layer 101B functions as a magnetization fixed layer. In this case, a magnetization direction of the magnetization free layer changes relative to a magnetization direction of the magnetization fixed layer. The first ferromagnetic layer 101A and the second ferromagnetic layer 101B have different coercivites, and the coercivity of a layer functioning as the magnetization fixed layer is larger than the coercivity of a layer functioning as the magnetization free layer. The thickness of each of the first ferromagnetic layer 101A and the second ferromagnetic layer 101B is preferably about 1 to 10 nm.

The first ferromagnetic layer 101A and the second ferromagnetic layer 101B are made of a known ferromagnetic material, for example, a metal such as Cr, Mn, Co, Fe, and Ni, and a material selected from among ferromagnetic alloys containing one or more of such metals so that they have different coercivites. In addition, each of the first ferromagnetic layer 101A and the second ferromagnetic layer 101B may be made of an alloy containing such metals and at least one of B, C, and N (specifically, Co—Fe or Co—Fe—B).

In addition, in order to obtain a higher output, a Heusler alloy such as $Co_2FeSi$ is preferably used. A Heusler alloy contains an intermetallic compound having a chemical composition of $X_2YZ$. X is a transition metal element from the Co, Fe, Ni, or Cu groups or a noble metal element in the periodic table, Y is a transition metal from the Mn, V, Cr or Ti groups or the same elements as for X, and Z is a typical element of Group III to Group V. Examples of the Heusler alloy include $Co_2FeSi$, $Co_2MnSi$, and $Co_2Mn_{1-a}Fe_aAl_bSi_{1-b}$ ($0 \leq a \leq 1$, $0 \leq b \leq 1$).

In order to fix the magnetization of the ferromagnetic layer (magnetization fixed layer) functioning as a magnetization fixed layer, an antiferromagnetic layer may be added so that it comes in contact with the magnetization fixed layer. In addition, the magnetic anisotropy caused by a crystal structure, a shape or the like may be used to fix the magnetization of the magnetization fixed layer. FeO, CoO, NiO, $CuFeS_2$, IrMn, FeMn, PtMn, Cr, Mn or the like can be used for the antiferromagnetic layer.

A nonmagnetic material is preferably used for the spacer layer 101C. The spacer layer 101C includes a layer composed of a conductor, an insulator or a semiconductor or a layer having an electric conduction point composed of a conductor in an insulator.

For example, when the spacer layer 101C is made of an insulator, the magnetoresistance effect element 101 is a tunnel magnetoresistance (TMR) effect element, and when the spacer layer 101C is made of a metal, the magnetoresistance effect element 101 is a giant magnetoresistance (GMR) effect element.

When an insulating material is applied for the spacer layer 101C, an insulating material such as $Al_2O_3$ or MgO can be used. A high magnetoresistance change ratio is obtained by adjusting the film thickness of the spacer layer 101C so that a coherent tunnel effect is exhibited between the first ferromagnetic layer 101A and the second ferromagnetic layer 101B. In order to efficiently use a TMR effect, the thickness of the spacer layer 101C is preferably about 0.5 to 3.0 nm.

When the spacer layer 101C is made of a conductive material, a conductive material such as Cu, Ag, Au or Ru can be used. In order to efficiently use a GMR effect, the thickness of the spacer layer 101C is preferably about 0.5 to 3.0 nm.

When the spacer layer 101C is made of a semiconductor, a material such as ZnO, $In_2O_3$, $SnO_2$, ITO, $GaO_x$ or $Ga_2O_x$ can be used. In this case, the thickness of the spacer layer 101C is preferably about 1.0 to 4.0 nm.

When a layer having an electric conduction point composed of a conductor in an insulator is applied as the spacer layer 101C, an insulator composed of $Al_2O_3$ or MgO preferably has a structure having an electric conduction point composed of a conductor such as CoFe, CoFeB, CoFeSi, CoMnGe, CoMnSi, CoMnAl, Fe, Co, Au, Cu, Al or Mg.

In this case, the thickness of the spacer layer 101C is preferably about 0.5 to 2.0 nm.

The magnetoresistance effect element 101 can be a magnetoresistance effect element in which both the first ferromagnetic layer 101A and the second ferromagnetic layer 101B are set as magnetization free layers, and which includes the two magnetization free layers and a spacer layer disposed between the two magnetization free layers. In this case, magnetization directions of the first ferromagnetic layer 101A and the second ferromagnetic layer 101B can be changed relative to each other. As an example, a magnetoresistance effect element in which two magnetization free layers are magnetically coupled with a spacer layer therebetween is an exemplary example. More specifically, an example in which two magnetization free layers are magnetically coupled with a spacer layer therebetween so that magnetization directions of the two magnetization free layers when no external magnetic field is applied are antiparallel to each other is an exemplary example.

<High-Frequency Signal Line>

When a high-frequency current flows, the high-frequency signal line 103 generates a high-frequency magnetic field, and a high-frequency magnetic field generated from at least a part thereof is applied to the first ferromagnetic layer 101A.

The high-frequency signal line 103 includes an overlapping part 103A disposed at a position overlapping the magnetoresistance effect element 101 and a non-overlapping part 103B (103Baa, 103Bab, 103Bba, and 103Bbb) disposed at a position not overlapping the magnetoresistance effect element 101 in a plan view from the stacking direction L. The overlapping part 103A is disposed apart from the magnetoresistance effect element 101 in the stacking direction L with an insulator 800 therebetween, as shown in FIG. 1.

A part denoted by reference sign 103Baa and a part denoted by reference sign 103Bba in the non-overlapping part 103B are parts extending in a direction parallel to the overlapping part 103A.

On the other hand, a part denoted by reference sign 103Bab and a part denoted by reference sign 103Bbb are parts connecting both the part denoted by reference sign 103Baa and the part denoted by reference sign 103Bba to the overlapping part 103A, and are disposed to be inclined with respect to the stacking direction L.

Hereinafter, the part denoted by reference sign 103Baa and the part denoted by reference sign 103Bba may be referred to as parallel parts. The part denoted by reference sign 103Bab and the part denoted by reference sign 103Bbb may be referred to as inclined connecting parts.

In the configuration shown in FIG. 1, the parallel part 103Baa and the parallel part 103Bba are disposed at the same position in the stacking direction L and formed with the same thickness. However, the parallel part 103Baa and the parallel part 103Bba may be disposed at different positions in the stacking direction L and may also differ in thickness.

In the arrangement shown in FIG. 1, when the overlapping part 103A is "above" a magnetoresistance effect element in the stacking direction L, a direction of Lu is "upward in the stacking direction," and a direction of Ld is "downward in the stacking direction."

In FIG. 1, reference sign 103BaaS indicates the lower surface in the stacking direction L of the parallel part 103Baa of the non-overlapping part 103B and reference sign 103BabS indicates the lower surface in the stacking direction L of the inclined connecting part 103Bab of the non-overlapping part 103B. Reference sign 103BbaS indicates the lower surface in the stacking direction L of the parallel part 103Bba of the non-overlapping part 103B and reference sign 103BbbS indicates the lower surface in the stacking direction L of the inclined connecting part 103Bbb of the non-overlapping part 103B. Reference sign 103BS indicates these four surfaces 103BaaS, 103BabS, 103BbaS, and 103BbbS together. Reference sign 103AS indicates the lower surface in the stacking direction L of the overlapping part 103A. Reference sign 103S indicates the entire lower surface in the stacking direction L of the high-frequency signal line 103, that is, the lower surface 103AS in the stacking direction L of the overlapping part 103A and the lower surface 103BS in the stacking direction L of the non-overlapping part 103B together.

A dotted line indicated by symbol X-X' indicates a virtual surface including the lower surface 103AS in the stacking direction L of the overlapping part 103A. A dotted line indicated by symbol Y indicates a virtual surface including the lower surface 103BaaS in the stacking direction L of the parallel part 103Baa and the lower surface 103BbaS in the stacking direction L of the parallel part 103Bba of the lower surface 103BS in the stacking direction L of the non-overlapping part 103B.

The lower surface 103BS in the stacking direction L of the non-overlapping part 103B of the lower surface 103S in the stacking direction L of the high-frequency signal line 103 is disposed below the lower surface 103AS in the stacking direction L of the overlapping part 103A in the stacking direction L. That is, the lower surface 103BaaS in the stacking direction L, the lower surface 103BabS in the stacking direction L, the lower surface 103BbaS in the stacking direction L, and the lower surface 103BbbS in the stacking direction L of the non-overlapping part 103B are disposed below the lower surface 103AS in the stacking direction L of the overlapping part 103A in the stacking direction L.

More specifically, the lower surface 103BaaS in the stacking direction L of the parallel part 103Baa and the lower surface 103BbaS in the stacking direction L of the parallel part 103Bba of the lower surface 103BS in the stacking direction L of the non-overlapping part 103B are disposed to the Ld side by a distance d (the distance between the virtual surface X-X' and the virtual surface Y). The lower surface 103BabS in the stacking direction L of the inclined connecting part 103Bab and the lower surface 103BbbS in the stacking direction L of the inclined connecting part 103Bbb of the lower surface 103BS in the stacking direction L of the non-overlapping part 103B are disposed to the Ld side by a distance of 0 to d.

For the effects of the present disclosure, it suffices that at least a part of the non-overlapping part 103B be disposed below the overlapping part 103A in the stacking direction L, assuming that the overlapping part 103A is above the magnetoresistance effect element 101 in the stacking direction L. However, the effect of increasing the strength of the high-frequency magnetic field is greater as a part of the non-overlapping part 103B becomes closer to the magnetoresistance effect element 101.

Figure 3:
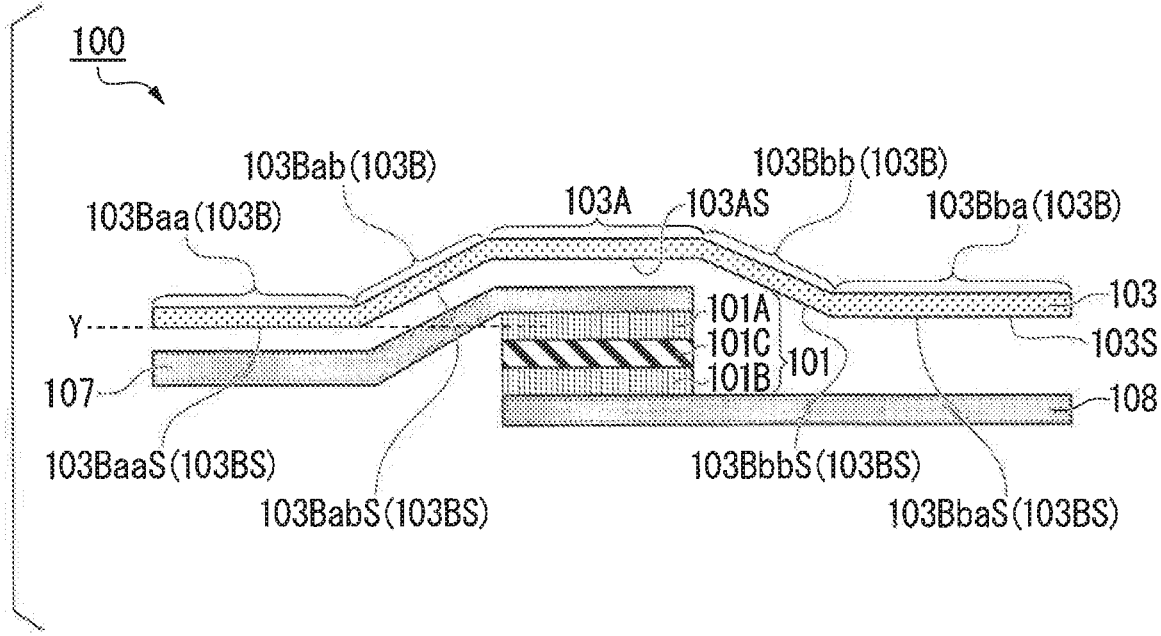
FIG. 3 is a schematic cross-sectional view showing that the lower surface in a stacking direction L of the high-frequency signal line is disposed at the same position as a first ferromagnetic layer in the stacking direction L.

In the high-frequency signal line 103 shown in FIG. 3, a part of the parallel part 103Baa and a part of the parallel part 103Bba, which are at least a part of the non-overlapping part 103B, are disposed below the overlapping part 103A in the stacking direction L, more specifically, at the same position as the first ferromagnetic layer 101A (such that the dotted line indicated by the symbol Y extends to the first ferromagnetic layer 101A in FIG. 3), thus making the effect of increasing the strength of the high-frequency magnetic field much greater.

If this configuration is described with reference to the surfaces of the parts, the lower surface 103BaaS in the stacking direction L of the parallel part 103Baa and the lower surface 103BbaS in the stacking direction L of the parallel part 103Bba, which are at least a part of the lower surface 103BS in the stacking direction L of the non-overlapping part 103B, are disposed below the lower surface 103AS in the stacking direction L of the overlapping part 103A in the stacking direction L, more specifically, at the same position as the first ferromagnetic layer 101A (see FIGS. 1 and 3).

It is preferable that at least a part of the non-overlapping part 103B be disposed at the same position as the first ferromagnetic layer 101A in the stacking direction L, and more preferable that at least a part of the non-overlapping part 103B be disposed below the first ferromagnetic layer 101A in the stacking direction L (see FIG. 4).

<Lines>

A first line 107 and a second line 108 are connected to the magnetoresistance effect element 101 at both ends thereof in the stacking direction L, that is, respectively on the first ferromagnetic layer 101A side and the second ferromagnetic layer 101B side thereof as viewed from the spacer layer 101C.

A current or voltage is applied to the magnetoresistance effect element 101 via at least one of the first line 107 and the second line 108. At least one of the first line 107 and the second line 108 transmits a signal output from the magnetoresistance effect element 101. For example, a DC current or a DC voltage is applied to the magnetoresistance effect element 101 via the first line 107 and the second line 108. Further, for example, the second line 108 transmits a signal (a high-frequency voltage or a high-frequency current) output from the magnetoresistance effect element 101.

For example, a material having conductivity such as Ta, Cu, Au, AuCu, Ru, or Al can be used for the first line 107 and the second line 108.

(Operational Effects)

Figure 2:
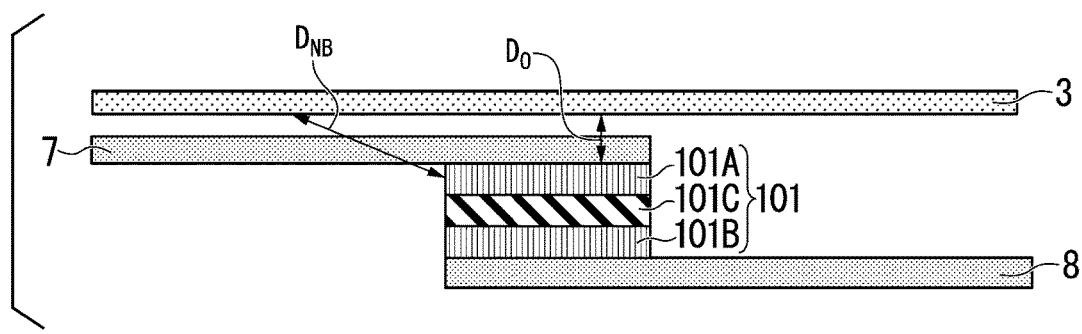
FIG. 2 is a schematic cross-sectional view when a high-frequency signal line has no curved portion.

FIG. 2 is a schematic cross-sectional view when the high-frequency signal line has no curved portion. In FIG. 2, reference sign 3 denotes a high-frequency signal line and reference signs 7 and 8 denote lines.

The strength of a high-frequency magnetic field generated in the first ferromagnetic layer 101A by a current flowing through the high-frequency signal line depends on the distance from the high-frequency signal line. If the distance is short, the strength of the high-frequency magnetic field is great and the magnetization of the first ferromagnetic layer 101A oscillates greatly. On the other hand, if the distance is long, the strength of the high-frequency magnetic field is small and the magnetization oscillation of the first ferromagnetic layer 101A is reduced.

The overlapping part of the high-frequency signal line has no difference in the distance $D_O$ to the first ferromagnetic layer 101A between the configuration shown in FIG. 1 and the configuration shown in FIG. 2 in which the high-frequency signal line has no curved portion. In contrast, the non-overlapping part is closer to the first ferromagnetic layer 101A in the configuration shown in FIG. 1 than in the configuration shown in FIG. 2 as $D_B$ and $D_{NB}$ indicate their representative distances to the first ferromagnetic layer 101A.

Second Embodiment

Figure 4:
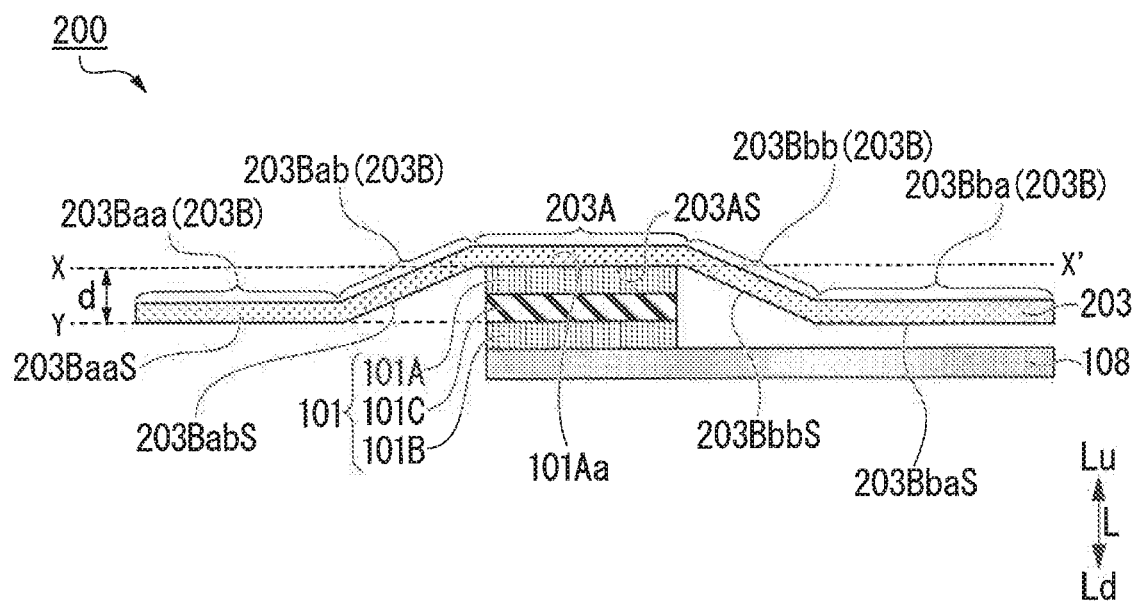
FIG. 4 is a cross-sectional view schematically showing an exemplary configuration of a magnetoresistance effect device 200 according to a second embodiment of the present disclosure.

FIG. 4 is a cross-sectional view schematically showing an exemplary configuration of a magnetoresistance effect device 200 according to a second embodiment of the present disclosure. Parts the same as in the first embodiment will be denoted with the same reference numerals regardless of differences in shapes.

In the magnetoresistance effect device 200, a high-frequency signal line 203 is connected to the magnetoresistance effect element 101 on the first ferromagnetic layer 101A side thereof as viewed from the spacer layer 101C (a surface 101Aa, opposite to the spacer layer, of the first ferromagnetic layer 101A in the example of FIG. 4) and a part of a high-frequency current flowing through the high-frequency signal line 203 is applied to the magnetoresistance effect element 101.

The high-frequency signal line 203 has an overlapping part 203A disposed at a position overlapping the magnetoresistance effect element 101 and a non-overlapping part 203B (203Baa, 203Bab, 203Bba, and 203Bbb) disposed at a position not overlapping the magnetoresistance effect element 101 in a plan view from the stacking direction L.

While the high-frequency signal line 203 has the same configuration as the high-frequency signal line 103 shown in FIG. 1, the difference from the magnetoresistance effect device 100 shown in FIG. 1 is that the line 107 shown in FIG. 1 is not provided and the overlapping part 203A of the high-frequency signal line 203 is electrically connected to the magnetoresistance effect element 101.

In FIG. 4, surfaces denoted by reference signs 203AS, 203BaaS, 203BabS, 203BbaS, and 203BbbS are the lower surfaces in the stacking direction L of the overlapping part 203A and the non-overlapping parts 203Baa, 203Bab, 203Bba, and 203Bbb, respectively.

In the configuration shown in FIG. 4 as well, at least the lower surfaces 203BabS and 203BbbS in the stacking direction L of the non-overlapping part are closer to the first ferromagnetic layer 101A than in the configuration in which the high-frequency signal line has no curved portion. As a result, the high-frequency magnetic field applied to the first ferromagnetic layer 101A from the non-overlapping part of the high-frequency signal line becomes greater.

Third Embodiment

Figure 5:
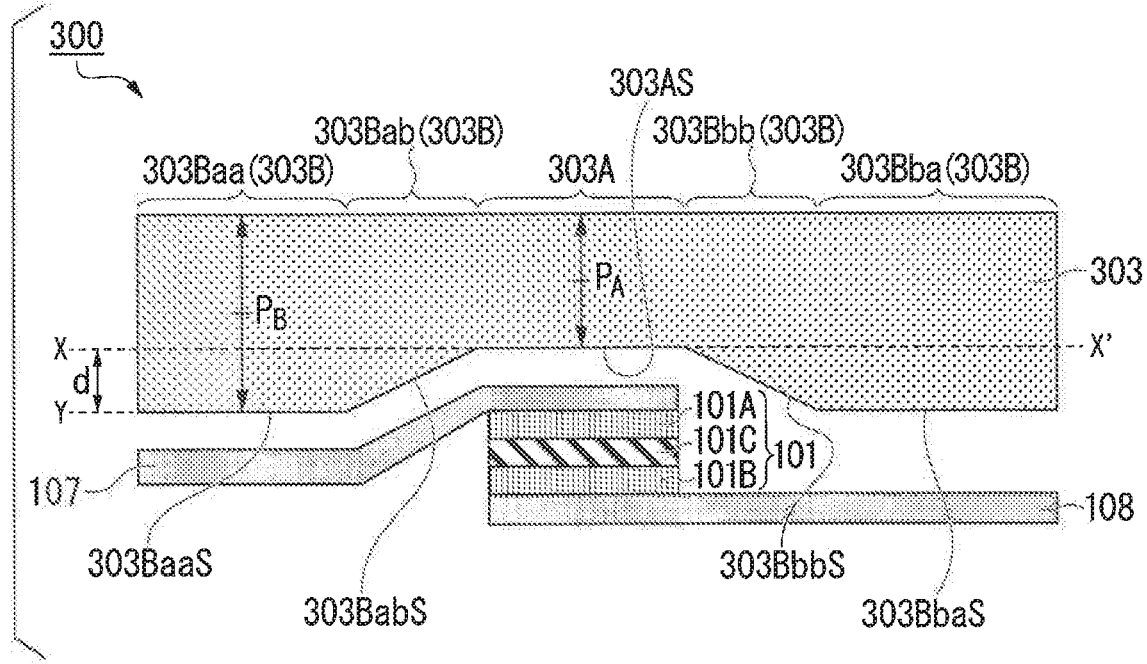
FIG. 5 is a cross-sectional view schematically showing an exemplary configuration of a magnetoresistance effect device 300 according to a third embodiment of the present disclosure.

FIG. 5 is a cross-sectional view schematically showing an exemplary configuration of a magnetoresistance effect device 300 according to a third embodiment of the present disclosure. Parts the same as in the second embodiment will be denoted with the same reference numerals regardless of the difference in shapes.

In the magnetoresistance effect device 100 according to the first embodiment, the high-frequency signal line 103 is formed such that the bending pattern of the lower surface in the stacking direction L and the bending pattern of the upper surface in the stacking direction L of the high-frequency signal line 103 are the same, the thickness of the high-frequency signal line 103 is the same, and the average position in the stacking direction L of the position of the lower surface and the position of the upper surface in the stacking direction L (the position midway in the thickness) of the high-frequency signal line 103 at at least a part of the non-overlapping part 103B is located below that of the overlapping part 103A in the stacking direction L. In contrast, in the magnetoresistance effect device 300 according to the third embodiment, the thickness of the high-frequency signal line 303 differs between the overlapping part 303A and the non-overlapping part 303B.

The high-frequency signal line 303 includes the overlapping part 303A disposed at a position overlapping the magnetoresistance effect element 101 and the non-overlapping part 303B (303Baa, 303Bab, 303Bba, and 303Bbb) disposed at a position not overlapping the magnetoresistance effect element 101 in a plan view from the stacking direction L. In the configuration shown in FIG. 5 as well, the high-frequency signal line 303 is formed such that the average position in the stacking direction L of the position of the lower surface and the position of the upper surface in the stacking direction L (the position midway in the thickness) of the high-frequency signal line 303 at at least a part of the non-overlapping part 303B (for example, the position of reference sign $P_B$ in FIG. 5) is located below that of the overlapping part 303A (for example, the position of reference sign $P_A$ in FIG. 5) in the stacking direction L.

In FIG. 5, surfaces denoted by reference signs 303AS, 303BaaS, 303BabS, 303BbaS, and 303BbbS are the lower surfaces in the stacking direction L of the overlapping part 303A and the non-overlapping parts 303Baa, 303Bab, 303Bba, and 303Bbb, respectively.

In the configuration shown in FIG. 5 as well, at least the lower surfaces 303BabS and 303BbbS in the stacking direction L of the non-overlapping part are closer to the first ferromagnetic layer 101A than in the configuration in which the high-frequency signal line has no curved portion. As a result, the high-frequency magnetic field applied to the first ferromagnetic layer 101A from the non-overlapping part of the high-frequency signal line becomes greater.

Fourth Embodiment

Figure 6:
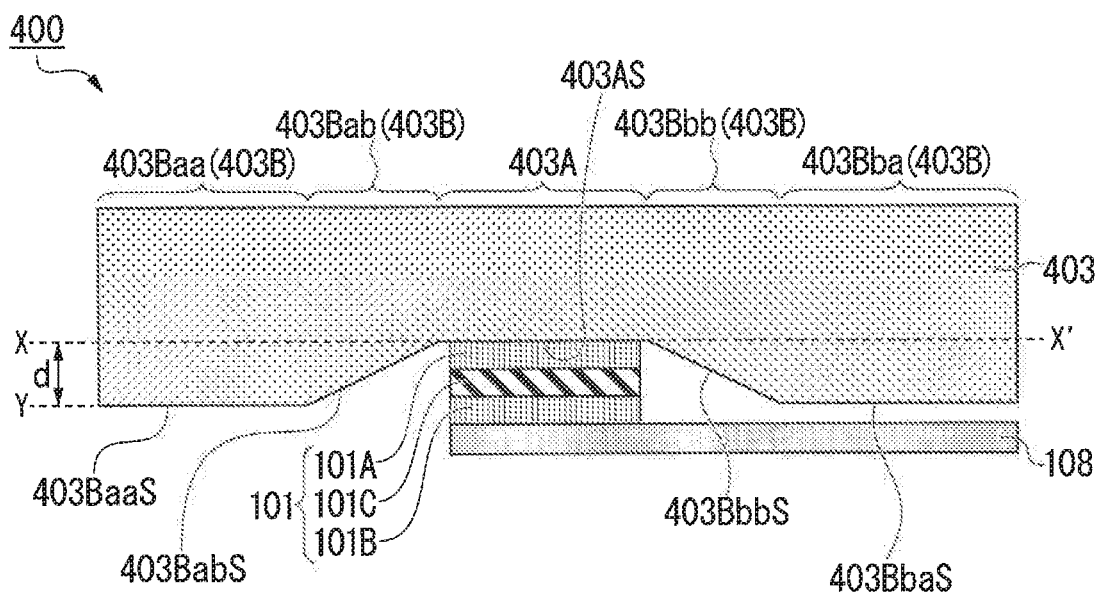
FIG. 6 is a cross-sectional view schematically showing an exemplary configuration of a magnetoresistance effect device 400 according to a fourth embodiment of the present disclosure.

FIG. 6 is a cross-sectional view schematically showing an exemplary configuration of a magnetoresistance effect device 400 according to a fourth embodiment of the present disclosure. Parts the same as in the third embodiment will be denoted with the same reference numerals regardless of the difference in shapes.

In the magnetoresistance effect device 400, a high-frequency signal line 403 is connected to the side of the first ferromagnetic layer 101A (in the example of FIG. 6, the surface 101Aa on the side opposite to the spacer layer of the first ferromagnetic layer 101A) when viewed from the spacer layer 101C of the magnetoresistance effect element 101. A part of a high-frequency current flowing through the high-frequency signal line 403 is applied to the magnetoresistance effect element 101.

In a plan view from the stacking direction L, the high-frequency signal line 403 includes an overlapping part 403A disposed at a position overlapping the magnetoresistance effect element 101 and a non-overlapping part 403B (403Baa, 403Bab, 403Bba, and 403Bbb) disposed at a position not overlapping the magnetoresistance effect element 101.

While the high-frequency signal line 403 has the same configuration as the high-frequency signal line 303 shown in FIG. 5, the difference from the magnetoresistance effect device 300 shown in FIG. 5 is that the line 107 shown in FIG. 5 is not provided and the overlapping part 403A of the high-frequency signal line 403 is electrically connected to the magnetoresistance effect element 101.

In FIG. 6, surfaces denoted by reference signs 403AS, 403BaaS, 403BabS, 403BbaS, and 403BbbS are the lower surfaces in the stacking direction L of the overlapping part 403A and the non-overlapping parts 403Baa, 403Bab, 403Bba, and 403Bbb, respectively.

In the configuration shown in FIG. 6 as well, at least the lower surfaces 403BabS and 403BbbS in the stacking direction L of the non-overlapping part are closer to the first ferromagnetic layer 101A than in the configuration in which the high-frequency signal line has no curved portion. As a result, the high-frequency magnetic field applied to the first ferromagnetic layer 101A from the non-overlapping part of the high-frequency signal line becomes greater.

Application Example 1

Figure 7:
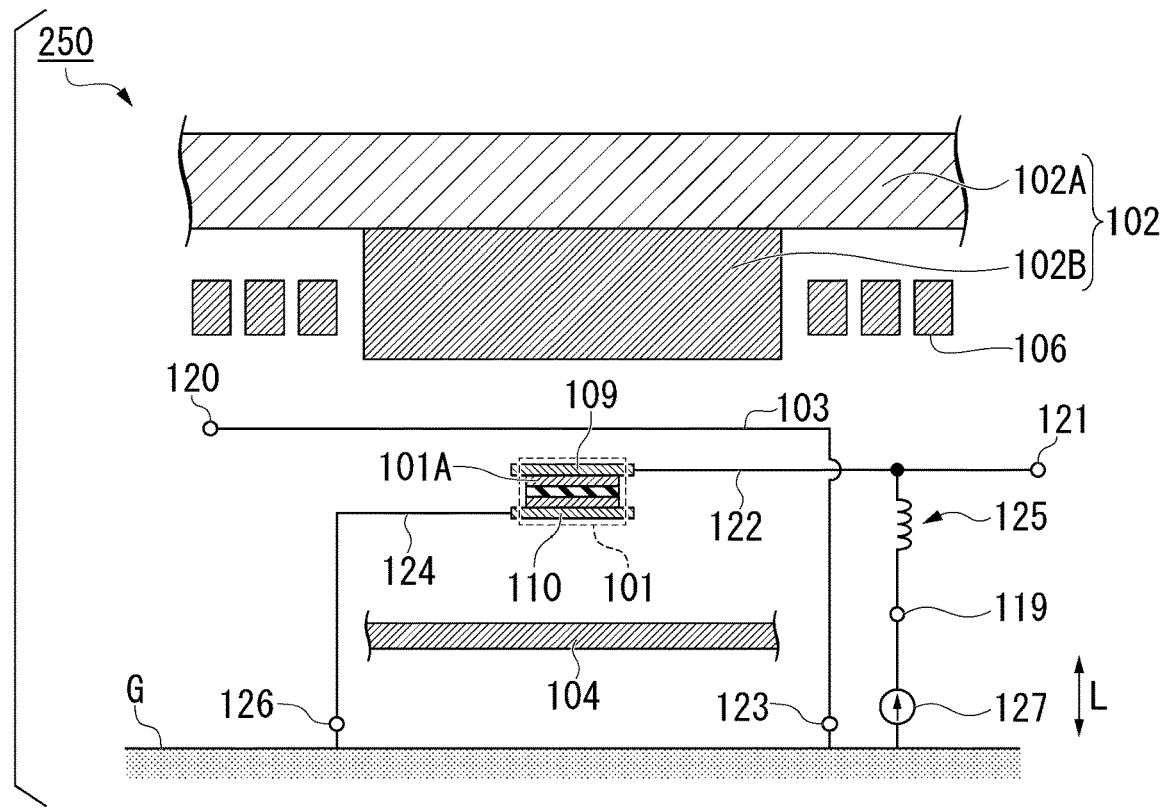
FIG. 7 is a diagram showing an exemplary configuration of a circuit of a high-frequency device to which a magnetoresistance effect device of the present disclosure is applied.

FIG. 7 shows an example of a circuit of a high-frequency device 250 to which the magnetoresistance effect device 100 is applied. The magnetoresistance effect device 100 may be replaced with the magnetoresistance effect device 300 according to another embodiment. Here, the high-frequency device 250 in which the above-described magnetoresistance effect element and high-frequency signal line and a magnetic field applying unit and another circuit element to be described below, and the like are incorporated may be collectively referred to as a magnetoresistance effect device. The high-frequency device 250 includes the magnetoresistance effect element 101, a first magnetic member 102, a second magnetic member 104, the high-frequency signal line 103, and a DC application terminal 119. The high-frequency device 250 receives a signal from a first port 120 and outputs a signal from a second port 121.

<Magnetoresistance Effect Element and Magnetic Field Applying Unit>

For the magnetoresistance effect element 101, as an example, an element that satisfies a configuration of the magnetoresistance effect device 100 according to the above first embodiment is used. In the example shown in FIG. 7, an upper electrode 109 and a lower electrode 110 are formed at both ends of the magnetoresistance effect element 101. In Application Example 1, an example in which the second ferromagnetic layer 101B functions as a magnetization fixed layer and the first ferromagnetic layer 101A functions as a magnetization free layer has been described. This also applies to Application Example 2 to be described below.

The first magnetic member 102 shown in FIG. 7 includes a base 102A and a protrusion 102B that protrudes toward the magnetoresistance effect element 101 (the side of one surface of a base) in a direction parallel to the stacking direction L. The protrusion 102B protrudes from one surface of the base toward the magnetoresistance effect element 101 in a direction parallel to the stacking direction L. The first magnetic member 102 is disposed on one side (the upper side in FIG. 1) of the magnetoresistance effect element 101 in a direction parallel to the stacking direction L.

The base 102A and the protrusion 102B may be integrated or separated. The protrusion 102B may have a multistage structure in which a plurality of protrusions are laminated in the protruding direction (for example, a multistage structure in which a group of cylinders of different diameters are laminated from the base 102A in descending order of diameter).

The protrusion may be one in which the cross-sectional area in the plane perpendicular to the protruding direction continuously changes or may include such a portion with the continuously changing cross-sectional area and a protrusion in which the cross-sectional area in the plane perpendicular to the protruding direction is constant. A coil 106 is wound around the protrusion 102B. The second magnetic member 104 is disposed opposite the first magnetic member 102 as viewed from the magnetoresistance effect element 101. The first magnetic member 102 and the second magnetic member 104 are connected in an outer area in the drawing by a magnetic member (not shown). The first magnetic member 102, the second magnetic member 104, and the coil 106 constitute a magnetic field applying unit configured to apply an external magnetic field (static magnetic field) to the magnetoresistance effect element 101.

A frequency of an output signal can be set using the magnetic field applying unit (the first magnetic member 102, the second magnetic member 104, and the coil 106). The frequency of the output signal oscillates according to a ferromagnetic resonance frequency of the first ferromagnetic layer 101A that functions as a magnetization free layer. The ferromagnetic resonance frequency of the first ferromagnetic layer 101A oscillates according to an effective magnetic field in the first ferromagnetic layer 101A. The effective magnetic field in the first ferromagnetic layer 101A can vary according to an external magnetic field (a static magnetic field). Therefore, when a magnitude of the external magnetic field applied from the magnetic field applying unit to the first ferromagnetic layer 101A is changed, a ferromagnetic resonance frequency of the first ferromagnetic layer 101A can be changed.

<First Port and Second Port>

A first port 120 is an input terminal of the high-frequency device 250. The first port 120 corresponds to one end of the high-frequency signal line 103. When an AC signal source (not shown) is connected to the first port 120, an AC signal (high-frequency signal) can be applied to the high-frequency device 250. A high-frequency signal applied to the high-frequency device 250 is, for example, a signal having a frequency of 100 MHz or more.

The second port 121 is an output terminal of the high-frequency device 250. The second port 121 corresponds to one end of an output signal line 122 through which a signal output from the magnetoresistance effect element 101 is transmitted. The output signal line 122 and the lower electrode 110 correspond to the second line 108 shown in FIG. 2.

<High-Frequency Signal Line>

One end of the high-frequency signal line 103 in FIG. 7 is connected to the first port 120. In addition, in the high-frequency device 250, the other end of the high-frequency signal line 103 is connected to a reference potential through a reference potential terminal 123 for use. In FIG. 7, the connection to a ground G as a reference potential is performed. The ground G that is attached to the outside of the high-frequency device 250 can be used. According to a potential difference between a high-frequency signal input to the first port 120 and the ground a high-frequency current flows in the high-frequency signal line 103. When a high-frequency current flows in the high-frequency signal line 103, a high-frequency magnetic field is generated from the high-frequency signal line 103. This high-frequency magnetic field is applied to the first ferromagnetic layer 101A of the magnetoresistance effect element 101.

<Output Signal Line and Other Lines>

The output signal line 122 transmits a signal output from the magnetoresistance effect element 101. The signal output from the magnetoresistance effect element 101 is a signal with a frequency selected using ferromagnetic resonance of the first ferromagnetic layer 101A functioning as a magnetization free layer. In the output signal line 122 in FIG. 7, one end is connected to the magnetoresistance effect element 101 via the upper electrode 109 and the other end is connected to the second port 121. That is, the output signal line 122 in FIG. 7 connects the magnetoresistance effect element 101 and the second port 121.

In addition, a capacitor may be provided in the output signal line 122 (as an example, the output signal line 122 between a part of an inductor 125 connected to the output signal line 122 and the second port 121) between a part constituting a closed circuit with a power supply 127, the output signal line 122, the magnetoresistance effect element 101, a line 124, and the ground G and the second port 121. When a capacitor is provided in the part, it is possible to avoid applying an invariant component of a current to an output signal output from the second port 121.

In the line 124, one end is connected to the magnetoresistance effect element 101 via the lower electrode 110. The line 124 and the lower electrode 110 correspond to the second line 108 shown in FIG. 1. In addition, in the high-frequency device 250, the other end of the line 124 is connected to a reference potential via a reference potential terminal 126 for use. While the line 124 is connected to the common ground Gas the reference potential of the high-frequency signal line 103 in FIG. 7, it may be connected to another reference potential. In order to simplify the circuit configuration, a reference potential of the high-frequency signal line 103 and a reference potential of the line 124 are preferably common.

As the shape of lines and the ground a micro strip line (MSL) type or a coplanar waveguide (CPW) type is preferably applied. When the micro strip line (MSL) type or the coplanar waveguide (CPW) type is applied, a line width and an inter-ground distance are preferably designed so that a characteristic impedance of a line and an impedance of a circuit system become the same. When designing is performed in this manner, it is possible to reduce transmission loss of the lines.

<DC Application Terminal>

The DC application terminal 119 is connected to the power supply 127, and a direct current or a DC voltage is applied to the magnetoresistance effect element 101 in the stacking direction L. In this specification, the direct current is a current whose direction does not vary with the time and includes a current whose magnitude oscillates with the time. In addition, the DC voltage is a voltage whose polarity does not vary with the time and includes a voltage whose magnitude oscillates with the time. The power supply 127 may be a direct current source or a DC voltage source.

The power supply 127 may be a direct current source that can generate a constant direct current or a DC voltage source that can generate a constant DC voltage. In addition, the power supply 127 may be a direct current source that can change a magnitude of a value of a generated direct current or may be a DC voltage source that can change a magnitude of a generated DC voltage value.

A current density of a current applied to the magnetoresistance effect element 101 is preferably lower than an oscillation threshold current density of the magnetoresistance effect element 101. The oscillation threshold current density of the magnetoresistance effect element refers to a current density at which the magnetization of a ferromagnetic layer functioning as a magnetization free layer of the magnetoresistance effect element starts precession at a constant frequency and a constant amplitude and serves as a threshold value at which the magnetoresistance effect element oscillates (an output (resistance value) of the magnetoresistance effect element fluctuates at a constant frequency and a constant amplitude).

The inductor 125 is disposed between the DC application terminal 119 and the output signal line 122. The inductor 125 cuts off a high-frequency component of a current and passes an invariant component of a current. An output signal (high-frequency signal) output from the magnetoresistance effect element 101 by the inductor 125 efficiently flows through the second port 121. In addition, an invariant component of a current flows through a closed circuit constituted by the power supply 127, the output signal line 122, the magnetoresistance effect element 101, the line 124, and the ground G by the inductor 125.

For the inductor 125, a resistance element including a chip inductor, an inductor with a pattern line, and an inductor component and the like can be used. The inductance of the inductor 125 is preferably 10 nH or more.

<Function of High-Frequency Device>

When a high-frequency signal is input to the high-frequency device 250 from the first port 120, a high-frequency current corresponding to the high-frequency signal flows in the high-frequency signal line 103. A high-frequency magnetic field generated by a high-frequency current that flows in the high-frequency signal line 103 is applied to the first ferromagnetic layer 101A of the magnetoresistance effect element 101.

The magnetization of the first ferromagnetic layer 101A functioning as a magnetization free layer oscillates greatly when a frequency of a high-frequency magnetic field applied to the first ferromagnetic layer 101A by the high-frequency signal line 103 is close to a ferromagnetic resonance frequency of the first ferromagnetic layer 101A. This phenomenon is a ferromagnetic resonance phenomenon.

When vibration of the magnetization of the first ferromagnetic layer 101A increases, a change in the resistance value in the magnetoresistance effect element 101 increases. For example, when a constant direct current is applied from the DC application terminal 119 to the magnetoresistance effect element 101, the change in the resistance value of the magnetoresistance effect element 101 as a change in the potential difference between the upper electrode 109 and the lower electrode 110 is output from the second port 121. In addition, for example, when a constant DC voltage is applied from the DC application terminal 119 to the magnetoresistance effect element 101, the change in the resistance value of the magnetoresistance effect element 101 as a change in the value of a current that flows between the lower electrode 110 and the upper electrode 109 is output from the second port 121.

That is, when the frequency of a high-frequency signal input from the first port 120 is a frequency close to a ferromagnetic resonance frequency of the first ferromagnetic layer 101A, the amount of change in the resistance value of the magnetoresistance effect element 101 is larger and a large signal is output from the second port 121. On the other hand, when the frequency of a high-frequency signal deviates from a ferromagnetic resonance frequency of the first ferromagnetic layer 101A, the amount of change in the resistance value of the magnetoresistance effect element 101 is smaller and a signal is hardly output from the second port 121. That is, the high-frequency device 250 functions as a high-frequency filter that can selectively pass a high-frequency signal with a specific frequency.

<Other Applications>

In addition, while a case in which the high-frequency device 250 is used as a high-frequency filter is shown in the above application examples, the high-frequency device 250 can be applied as a high-frequency device such as an isolator, a phase shifter, and an amplifier.

When the high-frequency device 250 is used as an isolator, a signal is input from the second port 121. Even if a signal is input from the second port 121, since it is not output from the first port 120, the device functions as an isolator.

In addition, if the high-frequency device 250 is used as a phase shifter, when an output frequency band oscillates, a frequency with one arbitrary point in an output frequency band is focused on. When an output frequency band oscillates, since a phase at a specific frequency oscillates, the device functions as a phase shifter.

In addition, when the high-frequency device 250 is used as an amplifier, a direct current or a DC voltage applied from the power supply 127 is set to be a predetermined magnitude or more. Accordingly, a signal output from the second port 121 is larger than a signal input from the first port 120 and the device functions as an amplifier.

As described above, the high-frequency device 250 can function as a high-frequency device such as a high-frequency filter, an isolator, a phase shifter, and an amplifier.

While a case in which there is one magnetoresistance effect element 101 is an exemplary example as shown in FIG. 7, a plurality of magnetoresistance effect elements 101 may be used. In this case, the plurality of magnetoresistance effect elements 101 may be connected in parallel or may be connected in series. For example, when a plurality of magnetoresistance effect elements 101 having different ferromagnetic resonance frequencies are used, it is possible to widen a selection frequency band (pass frequency band). In addition, a configuration in which a high-frequency magnetic field generated in the output signal line 122 that outputs an output signal from one magnetoresistance effect element 101 is applied to another magnetoresistance effect element 101 may be used. In such a configuration, since the output signal is filtered a plurality of times, it is possible to increase the filtering accuracy of the high-frequency signal.

Application Example 2

Figure 8:
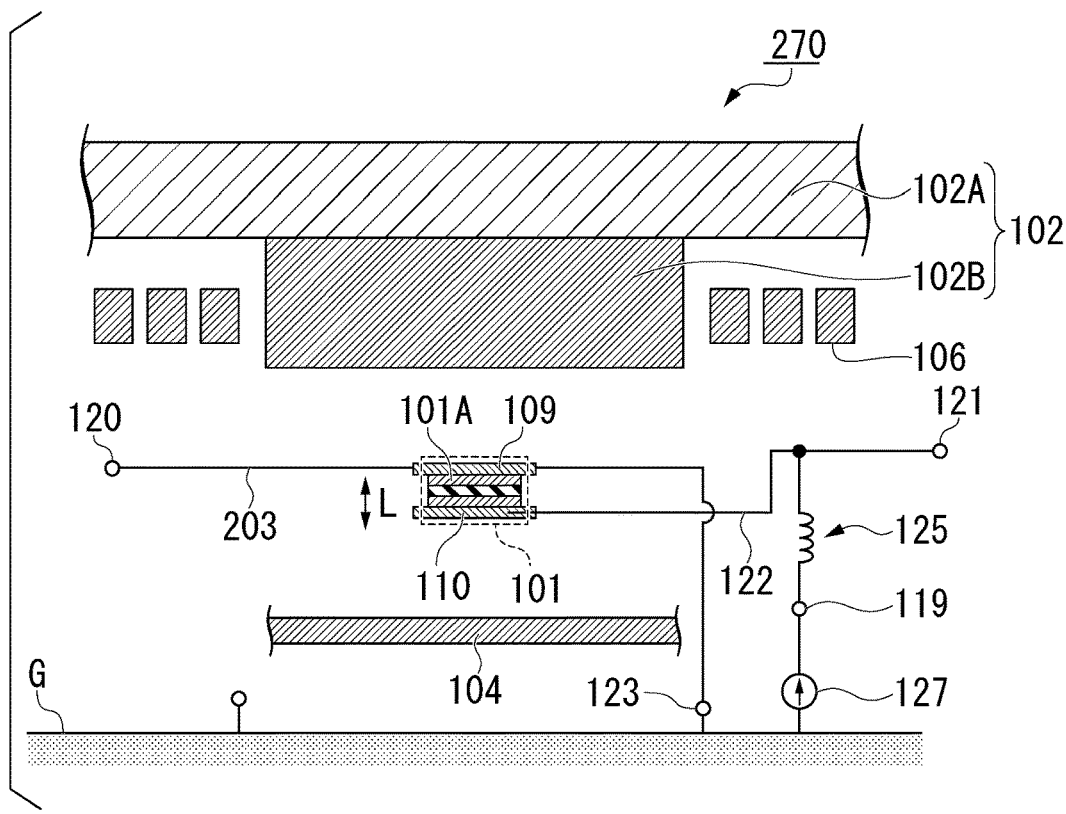
FIG. 8 is a diagram showing another exemplary configuration of a circuit of a high-frequency device to which a magnetoresistance effect device of the present disclosure is applied.

FIG. 8 shows an example of a circuit of a high-frequency device 270 to which the magnetoresistance effect device 200 is applied. The magnetoresistance effect device 200 may be replaced with the magnetoresistance effect device 400 according to another embodiment.

Here, in FIG. 8, a part of the high-frequency signal line 203 in the vicinity of the magnetoresistance effect element 101 is drawn as the upper electrode 109. In this case, the magnetization of the first ferromagnetic layer 101A can be vibrated using a high-frequency magnetic field that is generated from the high-frequency signal line 203 according to a high-frequency current that flows in the high-frequency signal line 203 and is applied to the magnetoresistance effect element 101 (the first ferromagnetic layer 101A). In addition, the magnetization of the first ferromagnetic layer 101A may be vibrated using a spin transfer torque that is generated by a high-frequency current that is applied from the high-frequency signal line 203 and flows through the magnetoresistance effect element 101 in the stacking direction L. In addition, the magnetization of the first ferromagnetic layer 101A may be vibrated using a spin orbit torque according to a spin current generated in a direction orthogonal to a flow direction of a high-frequency current that flows through a part corresponding to the upper electrode 109 of the high-frequency signal line 203. That is, the magnetization of the first ferromagnetic layer 101A can be vibrated using at least one of the high-frequency magnetic field, the spin transfer torque, and the spin orbit torque.

Like the high-frequency device 250, the high-frequency device 270 can function as a high-frequency device such as a high-frequency filter, a phase shifter, and an amplifier.

In Application Examples 1 and 2, the DC application terminal 119 may be connected between the inductor 125 and the ground G or may be connected between the upper electrode 109 and the ground G.

In addition, a resistance element may be used in place of the inductor 125 in Application Examples 1 and 2. The resistance element has a function of cutting out a high-frequency component of a current using a resistance component. The resistance element may be either a chip resistor or a resistor with a pattern line. The resistance value of the resistance element is preferably equal to or larger than a characteristic impedance of the output signal line 122. For example, when the characteristic impedance of the output signal line 122 is 50Ω and the resistance value of the resistance element is 50Ω, 45% of high-frequency power can be cut by the resistance element. In addition, when the characteristic impedance of the output signal line 122 is 50Ω and the resistance value of the resistance element is 500Ω, 90% of high-frequency power can be cut by the resistance element. In this case, an output signal output from the magnetoresistance effect element 101 can efficiently flow in the second port 121.

In addition, in Application Examples 1 and 2, when the power supply 127 connected to the DC application terminal 119 has a function of cutting out a high-frequency component of a current and also passing an invariant component of a current, the inductor 125 may be omitted. In this case, an output signal output from the magnetoresistance effect element 101 can efficiently flow through the second port 121.

As described above, according to the present disclosure, a greater high-frequency magnetic field can be applied to the magnetoresistance effect element.

While preferred embodiments of the disclosure have been described and shown above, it should be understood that these are exemplary of the disclosure and are not to be considered as limiting. Additions, omissions, substitutions, and other modifications can be made without departing from the spirit or scope of the present disclosure. Accordingly, the disclosure is not to be considered as being limited by the foregoing description, and is only limited by the scope of the appended claims.

What is claimed is:

1. A magnetoresistance effect device comprising:
    a magnetoresistance effect element including a first ferromagnetic layer, a second ferromagnetic layer and a spacer layer; and
    a high-frequency signal line,
    wherein in the magnetoresistance effect element, the first ferromagnetic layer, the second ferromagnetic layer, and the spacer layer are stacked along a stacking direction such that the spacer layer is disposed between the first ferromagnetic layer and the second ferromagnetic layer,
    the high-frequency signal line includes an overlapping part disposed at a position overlapping the magnetoresistance effect element and a non-overlapping part disposed at a position not overlapping the magnetoresistance effect element in a plan view from the stacking direction,
    the non-overlapping part comprises at least one first part extending in a direction parallel to the overlapping part and at least one second part connecting the at least one first part and the overlapping part,
    the at least one second part comprises an inclined part inclined to both the stacking direction and the at least one first part,
    at least a part of the inclined part is disposed below the overlapping part in the stacking direction, assuming that the overlapping part is above the magnetoresistance effect element in the stacking direction, and
    the overlapping part is disposed apart from the magnetoresistance effect element with an insulator therebetween.

2. The magnetoresistance effect device according to claim 1, wherein at least a part of the non-overlapping part disposed below the overlapping part in the stacking direction is disposed at the same position as the first ferromagnetic layer in the stacking direction.

3. A magnetoresistance effect device comprising:
    a magnetoresistance effect element including a first ferromagnetic layer, a second ferromagnetic layer and a spacer layer; and
    a high-frequency signal line,
    wherein in the magnetoresistance effect element, the first ferromagnetic layer, the second ferromagnetic layer, and the spacer layer are stacked along a stacking direction such that the spacer layer is disposed between the first ferromagnetic layer and the second ferromagnetic layer,
    the high-frequency signal line includes an overlapping part disposed at a position overlapping the magnetoresistance effect element and a non-overlapping part disposed at a position not overlapping the magnetoresistance effect element in a plan view from the stacking direction,
    the non-overlapping part comprises at least one first part with a thickness in the stacking direction larger than that of the overlapping part and at least one second part connecting the at least one first part and the overlapping part,
    the at least one second part comprises a third part with a thickness between the thickness of the at least one first part and a thickness of the overlapping part in the stacking direction,
    at least a part of the third part is disposed below the overlapping part in the stacking direction, assuming that the overlapping part is above the magnetoresistance effect element in the stacking direction, and
    the overlapping part is disposed apart from the magnetoresistance effect element with an insulator therebetween.

* * * * *